United States Patent
Jeon

(10) Patent No.: US 12,004,415 B2
(45) Date of Patent: Jun. 4, 2024

(54) DISPLAY DEVICE INCLUDING CUSHION LAYER AND DRIVE CHIP

(71) Applicant: Samsung Display Co., LTD., Yongin-si (KR)

(72) Inventor: Heechul Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/830,003

(22) Filed: Jun. 1, 2022

(65) Prior Publication Data

US 2022/0293872 A1 Sep. 15, 2022

Related U.S. Application Data

(60) Continuation of application No. 17/744,046, filed on May 13, 2022, now Pat. No. 11,793,062, which is a (Continued)

(30) Foreign Application Priority Data

Sep. 23, 2019 (KR) .......................... 10-2019-0116924

(51) Int. Cl.
*H10K 50/84* (2023.01)
*H01L 25/18* (2023.01)
(Continued)

(52) U.S. Cl.
CPC ............ *H10K 77/111* (2023.02); *H01L 25/18* (2013.01); *H10K 50/844* (2023.02);
(Continued)

(58) Field of Classification Search
CPC ............ H01L 51/0097; H01L 51/5253; H01L 51/502; H01L 51/5237; H01L 51/5246; H01L 51/52; H01L 2251/301; H01L 2251/5338; H01L 25/18; H01L 27/3269; H01L 27/3244; G02F 1/133305;
(Continued)

(56) References Cited

U.S. PATENT DOCUMENTS 9,977,466 B2 5/2018 Kwon et al.
10,032,847 B2 7/2018 Jeon
(Continued)

FOREIGN PATENT DOCUMENTS

JP 2018-120078 8/2018
KR 10-2011-0131223 12/2011
(Continued)

*Primary Examiner* — Ida M Soward
(74) *Attorney, Agent, or Firm* — KILE PARK REED & HOUTTEMAN PLLC

(57) ABSTRACT

A display device includes a substrate including a first region, a second region, and a bending region between the first region and the second region, a protective substrate disposed below the substrate in the first region, the second region, and the bending region, a cushion layer disposed below the protective substrate in the first region and the second region, a pixel layer disposed on the substrate in the second region, and a drive chip disposed on the substrate in the first region. The substrate is bent at the bending region such that the first region overlaps the second region.

15 Claims, 13 Drawing Sheets

Related U.S. Application Data division of application No. 16/991,558, filed on Aug. 12, 2020, now Pat. No. 11,355,718.

(51) Int. Cl.
    *H10K 50/844*      (2023.01)
    *H10K 77/10*      (2023.01)
    *G02F 1/1333*      (2006.01)
    *G06F 1/16*      (2006.01)
    *G09G 3/3266*      (2016.01)
    *G09G 3/3275*      (2016.01)
    *G09G 3/3283*      (2016.01)
    *G09G 3/3291*      (2016.01)
    *H10K 50/115*      (2023.01)
    *H10K 50/842*      (2023.01)
    *H10K 59/13*      (2023.01)
    *H10K 59/88*      (2023.01)
    *H10K 102/00*      (2023.01)

(52) U.S. Cl.
CPC .. *G02F 1/133305* (2013.01); *G02F 1/133331* (2021.01); *G06F 1/1641* (2013.01); *G06F 1/1652* (2013.01); *G09G 3/3266* (2013.01); *G09G 3/3275* (2013.01); *G09G 3/3283* (2013.01); *G09G 3/3291* (2013.01); *G09G 2300/0408* (2013.01); *H10K 50/115* (2023.02); *H10K 50/84* (2023.02); *H10K 50/8426* (2023.02); *H10K 59/13* (2023.02); *H10K 59/88* (2023.02); *H10K 2102/00* (2023.02); *H10K 2102/311* (2023.02)

(58) Field of Classification Search
CPC ............. G02F 1/133331; G06F 1/1641; G06F 1/1652; G09F 9/301; G09G 3/3275; G09G 3/3266; G09G 3/3283; G09G 3/3291; G09G 2300/0408; H10K 50/844; H10K 50/115; H10K 50/84; H10K 50/8426; H10K 50/80; H10K 59/13; H10K 59/88; H10K 59/12; H10K 2102/00; H10K 2102/311
See application file for complete search history.

(56) References Cited

U.S. PATENT DOCUMENTS

| | | | |
|---|---|---|---|
| 10,151,942 B2 * | 12/2018 | Cheng | H01L 51/0097 |
| 10,263,203 B2 | 4/2019 | Oh et al. | |
| 10,340,326 B2 * | 7/2019 | Yuan | H01L 27/3276 |
| 10,381,594 B2 | 8/2019 | Jiang | |
| 10,446,770 B2 | 10/2019 | Kim et al. | |
| 10,700,311 B2 * | 6/2020 | Kwon | H10K 71/00 |
| 10,782,807 B2 | 9/2020 | Sasaki | |
| 10,811,623 B2 * | 10/2020 | Park | H10K 59/1213 |
| 10,816,836 B2 | 10/2020 | Cheng | |
| 10,818,873 B2 | 10/2020 | Kwon et al. | |
| 10,873,043 B2 | 12/2020 | Jin | |
| 10,916,735 B2 * | 2/2021 | Kwon | H01L 51/5092 |
| 10,978,494 B2 | 4/2021 | An et al. | |
| 11,087,110 B2 * | 8/2021 | Park | H01L 27/3234 |
| 11,107,373 B2 | 8/2021 | Ha et al. | |
| 2014/0042406 A1 | 2/2014 | Degner et al. | |
| 2014/0306941 A1 * | 10/2014 | Kim | H10K 59/131 |
| | | | 345/204 |
| 2018/0062090 A1 | 3/2018 | Kim et al. | |
| 2018/0081399 A1 * | 3/2018 | Kwon | G09G 5/00 |
| 2018/0123060 A1 | 5/2018 | Jang et al. | |
| 2018/0151641 A1 * | 5/2018 | Choo | H04M 1/0266 |
| 2018/0197933 A1 | 7/2018 | Son et al. | |
| 2018/0231823 A1 | 8/2018 | Hyodo et al. | |
| 2019/0019441 A1 | 1/2019 | Shin et al. | |
| 2019/0043928 A1 * | 2/2019 | Hong | H10K 59/131 |
| 2019/0109181 A1 * | 4/2019 | Chung | H10K 50/844 |
| 2019/0165332 A1 | 5/2019 | Kwon et al. | |
| 2019/0207130 A1 * | 7/2019 | He | H10K 71/80 |
| 2019/0245157 A1 | 8/2019 | Chung et al. | |
| 2019/0252412 A1 * | 8/2019 | An | H10K 77/111 |
| 2019/0341443 A1 | 11/2019 | Son et al. | |
| 2020/0022267 A1 | 1/2020 | Han et al. | |
| 2021/0028379 A1 * | 1/2021 | Park | H10K 59/1213 |
| 2021/0174111 A1 | 6/2021 | Im et al. | |

FOREIGN PATENT DOCUMENTS

| | | | |
|---|---|---|---|
| KR | 10-2015-0060716 | 6/2015 | |
| KR | 10-2016-0083315 | 7/2016 | |
| KR | 10-2017-0113870 | 10/2017 | |
| KR | 10-2018-0079580 | 7/2018 | |
| KR | 20190060913 A * | 6/2019 | .......... G09G 3/3208 |

* cited by examiner

DISPLAY DEVICE INCLUDING CUSHION LAYER AND DRIVE CHIP

CROSS REFERENCE TO RELATED APPLICATION(S)

This is a continuation application of U.S. patent application Ser. No. 17/744,046, filed May 13, 2022, the disclosure of which is incorporated herein by reference in its entirety. U.S. patent application Ser. No. 17/744,046 is a divisional application of U.S. patent application Ser. No. 16/991,558, filed Aug. 12, 2020 (now U.S. Pat. No. 11,355,718), the disclosure of which is herein by reference in its entirety. U.S. patent application Ser. No. 16/991,558 claims priority benefit of Korean Patent Application No. 10-2019-0116924 under 35 U.S.C. § 119, filed on Sep. 23, 2019, the disclosure of which is incorporated herein by reference in its entirety for all purposes.

BACKGROUND

1. Technical Field

The disclosure relates to a display device in which a bending region of a display panel may be more easily bent and the thickness of the display panel may be reduced, and a carrier panel.

2. Description of the Related Art

A display device that provides an image to a user, such as a monitor, an iPad, a smartphone, and a tablet PC, includes a display panel that displays the image. Various types of display panels are being developed, such as liquid crystal display panels, organic light emitting display panels, electrowetting display panels, and electrophoretic display panels.

As part of the technological development of display devices, display devices including flexible display panels are being developed. A display panel may include pixels for displaying an image and a drive chip for driving the pixels. The pixels may be arranged in a display region of the display panel and the drive chip may be disposed in a non-display region of the display panel surrounding the display region. A bending portion may be defined between the drive chip and the display region, and the bending portion may be bent, so that the drive chip may be disposed below the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed.

SUMMARY

The disclosure provides a display device in which a bending region of a display panel may be more easily bent and the thickness of the display panel may be reduced, and a carrier panel.

An embodiment of the disclosure may provide a display device that may include a substrate including a first region, a second region, and a bending region between the first region and the second region, a protective substrate disposed below the substrate in the first region, the second region, and the bending region, a cushion layer disposed below the protective substrate in the first region and the second region, a pixel layer disposed on the substrate in the second region, and a drive chip disposed on the substrate in the first region. The substrate may be bent at the bending region such that the first region may overlap the second region.

The protective substrate has a thickness smaller than a thicknesses of each of the substrate and the cushion layer. The thickness of the protective substrate may be in a range of about 5 µm to about 20 µm.

The protective substrate may include a polyimide. The polyimide may be colored.

The display device may further include a first adhesive layer disposed between the substrate and the protective substrate, and a second adhesive layer disposed between the protective substrate and the cushion layer.

The cushion layer and the second adhesive layer may be disposed at an area excluding the bending region.

The second region may include a display region, and a non-display region adjacent to the display region. The pixel layer is disposed on the substrate in the display region.

The display device may further include a thin film encapsulation layer disposed on the substrate in the second region and covering the pixel layer, an input sensing part disposed on the thin film encapsulation layer, and a window disposed on the input sensing part and extending over the bending region.

The display device may further include a protective layer disposed on the substrate in the bending region and extending to the drive chip.

In an embodiment of the disclosure, a display device may include a substrate including a first region, a second region, and a bending region between the first region and the second region, a protective substrate disposed below the substrate in the first region, a cushion layer disposed below the protective substrate in the first region and below the substrate in the second region, a pixel layer disposed on the substrate in the second region; and a drive chip disposed on the substrate in the first region. The substrate may be bent at the bending region such that the first region overlaps the second region.

The protective substrate may have a thickness smaller than a thicknesses of each of the substrate and the cushion layer. The protective substrate may include a colored polyimide.

The protective substrate may be disposed at an area excluding the bending region and the second region, and the cushion layer may be disposed at an area excluding the bending region.

The display device may further include a first adhesive layer disposed between the substrate and the protective substrate in the first region, and a second adhesive layer disposed between the protective substrate and the cushion layer in the first region and between the substrate and the cushion layer in the second region.

The second region may include a display region, and a non-display region adjacent to the display region. The pixel layer may be disposed on the substrate in the display region.

The display device may further include a thin film encapsulation layer disposed on the substrate in the second region and covering the pixel layer, an input sensing part disposed on the thin film encapsulation layer, and a window disposed on the input sensing part and extending over the bending region.

The display device may further comprise a protective layer disposed on the substrate in the bending region and extending to the drive chip.

In an embodiment of the disclosure, a carrier panel may include a substrate including a first region, a second region, and a bending region disposed between the first region and the second region, a pixel layer disposed on the substrate, a protective substrate disposed below the substrate, a first adhesive layer disposed between the substrate and the protective substrate, a carrier film disposed below the protective substrate, and a dummy adhesive layer disposed between the protective substrate and the carrier film. An adhesion layer of the dummy adhesive layer may be weaker than an adhesion of the first adhesive layer. The protective substrate may have a thickness smaller than a thicknesses of each of the substrate and the carrier film.

The protective substrate and the first adhesive layer may be disposed at an area including the first region and excluding the second region and the bending region, and the dummy adhesive layer may be disposed between the protective substrate and the carrier film in the first region, and is disposed between the substrate and the carrier film in the second region and the bending region.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to describe principles of the disclosure. In the drawings.

DETAILED DESCRIPTION OF THE EMBODIMENTS

Figure 1:
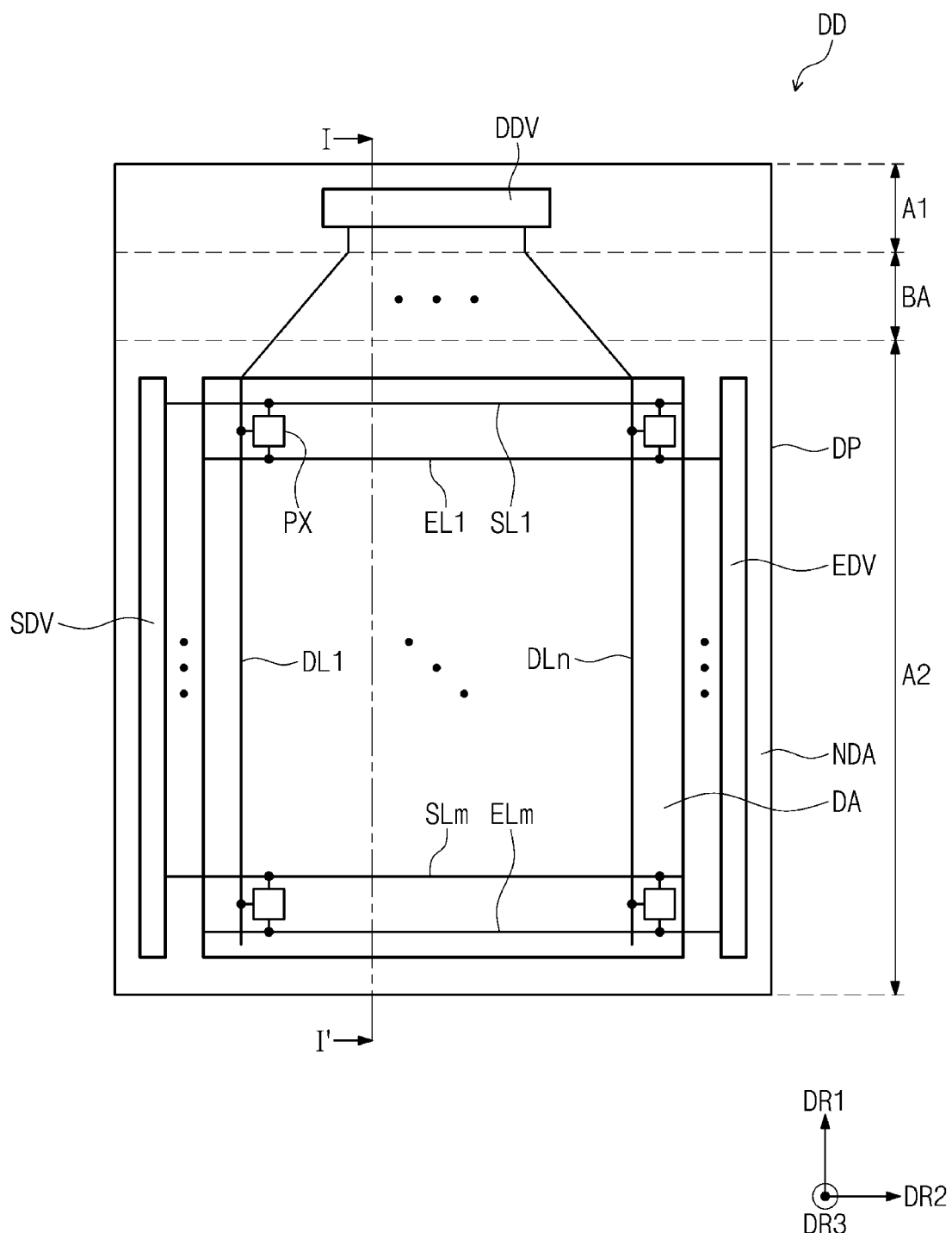
FIG. 1 is a schematic plan view of a display device according to an embodiment.

Hereinafter, embodiments will be explained in detail with reference to the accompanying drawings. Like reference numerals refer to like elements throughout this specification. In the figures, the thicknesses, ratios and dimensions of elements may be exaggerated for effective description of the technical contents.

It will be understood that when an element or layer is referred to as being "on", "connected to", "coupled to", "below", or the like with respect to another element or layer, it can be directly on, connected to, coupled to, below, or the like with respect to the other element or layer, or intervening elements or layers may be present.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The term "overlap" may include layer, stack, face or facing, extending over, covering or partly covering or any other suitable term as would be appreciated and understood by those of ordinary skill in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" or "have", when used in this specification, specify the presence of stated features, integers, steps, operations, elements, and/or components, but do not preclude the presence or addition of one or more other features, integers, steps, operations, elements, components, and/or groups thereof.

FIG. 1 is a schematic plan view of a display device DD according to an embodiment of the disclosure.

Referring to FIG. 1, the display device DD may include a display panel DP, a scan driver SDV, a data driver DDV, and an emission driver EDV.

The display panel DP may be a flexible display panel. For example, the display panel DP may include electronic elements disposed on a flexible substrate. The display panel DP may have a rectangular shape having long sides in a first direction DR1 and short sides in a second direction DR2. Hereinafter, a direction perpendicular to a plane defined by the first and second directions DR1 and DR2 may be defined as a third direction DR3.

The display panel DP may include a first region A1, a second region A2, and a bending region BA between the first region A1 and the second region A2. The bending region BA may extend in the second direction DR2, and the first region A1, the bending region BA, and the second region A2 may be arranged in the first direction DR1.

The second region A2 may include a display region DA and a non-display region NDA around the display region DA. The non-display region NDA may surround the display region DA. The display region DA may be a region in which an image may be displayed, and the non-display region NDA may be a region in which an image may not be displayed. The first region A1 and the bending region BA may be regions in which an image may not be displayed. The regions in which an image may not be displayed may be defined as a bezel region.

The display panel DP may include pixels PX, scan lines SL1 to SLm, data lines DL1 to DLn, and light emission lines EL1 to ELm. where m and n may be natural numbers. Although the pixels PX may be arranged in a matrix form, the pixels PX are not limited thereto and may be arranged in a variety of forms. The pixels PX may be arranged in the display region DA, and may be connected to the scan lines SL1 to SLm, the data lines DL1 to DLn, and the light emission lines EL1 to ELm.

The scan driver SDV and the emission driver EDV may be disposed in the non-display region NDA, and the data driver DDV may be disposed in the first region A1. The scan driver SDV and the emission driver EDV may be respectively disposed in two portions of the non-display region NDA adjacent to the long sides of the display panel DP. The data driver DDV may be manufactured in the form of an integrated circuit chip and disposed in the first region A1.

The scan lines SL1 to SLm may extend in the second direction DR2 to be connected to the scan driver SDV. The data lines DL1 to DLn may extend in the first direction DR1, and may be connected to the data driver DDV through the bending region BA. The light emission lines EL1 to ELm may extend in the second direction DR2 to be connected to the emission driver EDV.

The scan driver SDV may generate scan signals, and the scan signals may be applied to the pixels PX through the scan lines SL1 to SLm. The scan signals may be sequentially applied to the pixels PX. The data driver DDV may generate data voltages, and the data voltages may be applied to the pixels PX through the data lines DL1 to DLn. The emission driver EDV may generate light emission signals, and the light emission signals may be applied to the pixels PX through the light emission lines EL1 to ELm.

Although not illustrated, a timing controller (not illustrated) for controlling operations of the scan driver SDV, the data driver DDV, and the emission driver EDV may be included in the display device DD.

The timing controller may generate a scan control signal, a data control signal, and a light emission control signal in response to control signals received from the outside. The timing controller may receive image signals from the outside, and convert a data format of the image signals according to an interface specification with the data driver DDV to provide the image signals having the converted data format to the data driver DDV.

The scan driver SDV may generate the scan signals in response to the scan control signal, and the emission driver EDV may generate the light emission signals in response to the light emission control signal. The data driver DDV may receive the image signals having the converted data format, and generate the data voltages corresponding to the image signals in response to the data control signal.

The pixels PX may receive the data voltages in response to the scan signals. The pixels PX may display an image by emitting light beams having luminance levels corresponding to the data voltages in response to the light emission signals. The light emission time of the pixels PX may be controlled by the light emission signals.

Figure 2:
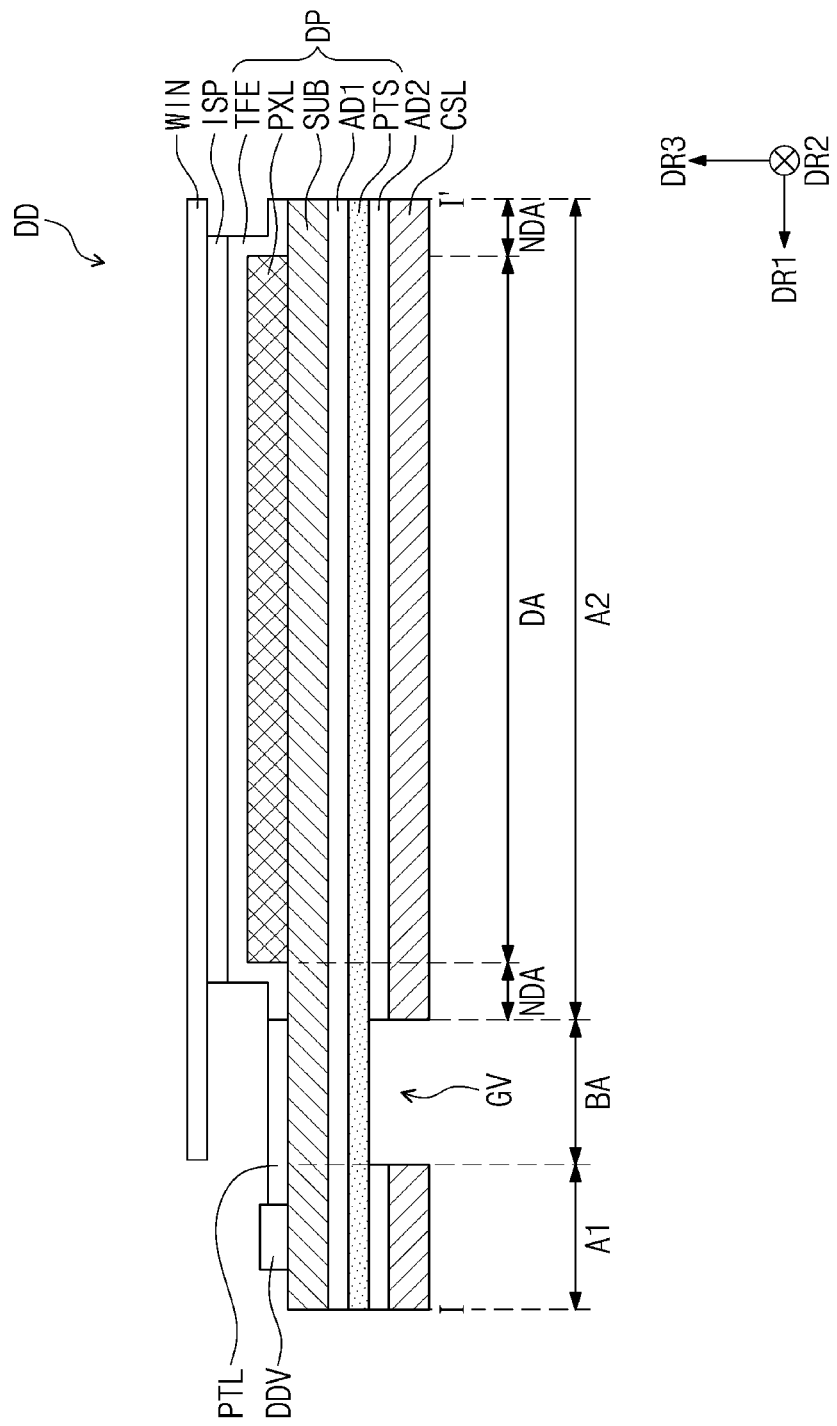
FIG. 2 is a schematic cross-sectional view taken along line I-I' illustrated in FIG. 1.

FIG. 2 is a schematic cross-sectional view taken along line I-I' illustrated in FIG. 1.

Referring to FIG. 2, the display device DD may include the display panel DP, an input sensing part ISP disposed on the display panel DP, a window WIN disposed on the input sensing part ISP, and a cushion layer CSL disposed below the display panel DP.

The display panel DP according to an embodiment of the disclosure may be a light emitting display panel and is not particularly limited. For example, the display panel DP may be an organic light emitting display panel or a quantum dot light emitting display panel. A light emitting layer of an organic light emitting display panel may include an organic light emitting material. A light emitting layer of a quantum dot light emitting display panel may include a quantum dot, a quantum rod, or the like. Hereinafter, the display panel DP is described as an organic light emitting display panel.

The display panel DP may include a substrate SUB, a pixel layer PXL disposed on the substrate SUB, a thin film encapsulation layer TFE disposed on the substrate SUB so as to cover the pixel layer PXL, and a protective substrate PTS disposed below the substrate SUB. The substrate SUB may be a transparent substrate and may include a flexible plastic substrate. For example, the substrate SUB may include a transparent polyimide (PI).

The substrate SUB, like the display panel DP, may include a first region A1, a second region A2, and a bending region BA between the first region A1 and the second region A2. The bending region BA may extend in the second direction DR2, and the first region A1, the bending region BA, and the second region A2 may be arranged in the first direction DR1. The second region A2 may include a display region DA and a non-display region NDA around the display region DA.

The pixel layer PXL may be disposed on the substrate SUB in the display region DA. The pixels PX illustrated in FIG. 1 may be arranged in the pixel layer PXL.

The data driver DDV may be disposed on the substrate SUB in the first region A1. The data driver DDV may be defined as a drive chip DDV hereinafter. A protective layer PTL may be disposed on the substrate SUB in the bending region BA. The protective layer PTL may be disposed adjacent to the thin film encapsulation layer TFE and may extend to the drive chip DDV. The protective layer PTL may be disposed on wires extending from the pixel layer PXL to the data driver DDV and thus may protect the wires.

The thin film encapsulation layer TFE may be disposed on the substrate SUB in the second region A2 so as to cover the pixel layer PXL. The thin film encapsulation layer TFE may include at least two inorganic layers and an organic layer disposed between the inorganic layers. The inorganic layers may include an inorganic material and may protect the pixel layer PXL from moisture and/or oxygen. The organic layer may include an organic material and may protect the pixel layer PXL from foreign matter such as dust particles.

The input sensing part ISP may be disposed on the thin film encapsulation layer TFE. The input sensing part ISP may sense an external input such as a user's touch, convert the external input into an input signal, and provide the input signal to the display panel DP. The input sensing part ISP may include sensors (not illustrated) for sensing the external input. The sensors may sense the external input in a capacitive method. The display panel DP may receive the input signal from the input sensing part ISP and generate an image corresponding to the input signal.

The window WIN may protect the display panel DP and the input sensing part ISP from scratches and impacts from the outside. Although not illustrated, an adhesive may attach the window WIN to the input sensing part ISP. The adhesive may include an optical clear adhesive. The image generated in the display panel DP may be provided to a user through the window WIN.

The protective substrate PTS may protect a lower portion of the display panel DP. The protective substrate PTS may include a flexible plastic substrate. For example, the protective substrate PTS may include a colored polyimide. A colored polyimide may be more affordable than a transparent polyimide. By using an affordable colored polyimide as the protective substrate PTS, the manufacturing cost of the display device DD may be lowered.

A polyimide may have a smaller modulus than polyethylene terephthalate (PET). Thus, a protective substrate PTS including a polyimide may be more easily bent than a protective substrate including polyethylene terephthalate.

The cushion layer CSL may protect the display panel DP by absorbing an external impact applied to the lower portion of the display panel DP. The cushion layer CSL may include a foam sheet having elastic force. The cushion layer CSL may be disposed below the protective substrate PTS in the first and second regions A1 and A2. The cushion layer CSL may not be disposed in the bending region BA. For example, the cushion layer CSL may be disposed at an area including the first and second regions A1 and A2 and excluding the bending region BA.

The protective substrate PTS may have a thickness smaller than the thicknesses of the substrate SUB and the cushion layer CSL. The protective substrate PTS may have a thickness of about 5 μm to about 20 μm.

A first adhesive layer AD1 may be disposed between the substrate SUB and the protective substrate PTS. The protective substrate PTS may be attached to the substrate SUB by the first adhesive layer AD1. Although the first adhesive layer AD1 may include a pressure sensitive adhesive, the first adhesive layer AD1 is not limited thereto and may include various adhesives.

A second adhesive layer AD2 may be disposed between the protective substrate PTS and the cushion layer CSL. The cushion layer CSL may be attached to the protective substrate PTS by the second adhesive layer AD2. Although the second adhesive layer AD2 may include a pressure sensitive adhesive, the second adhesive layer AD2 is not limited thereto and may include various adhesives. The second adhesive layer AD2 may not be disposed in the bending region BA, but may be disposed in the first and second regions A1 and A2. That is, the second adhesive layer may be disposed at area excluding the bending region BA.

Because the cushion layer CSL and the second adhesive layer AD2 may not be disposed in the bending region BA, a groove GV may be defined below the protective substrate PTS in the bending region BA. Accordingly, the thickness of the display device DD may be reduced in the bending region BA. For example, the cushion layer CSL and the second adhesive layer AD2 may define a groove GV below the protective substrate in the bending region BA.

Figure 3:
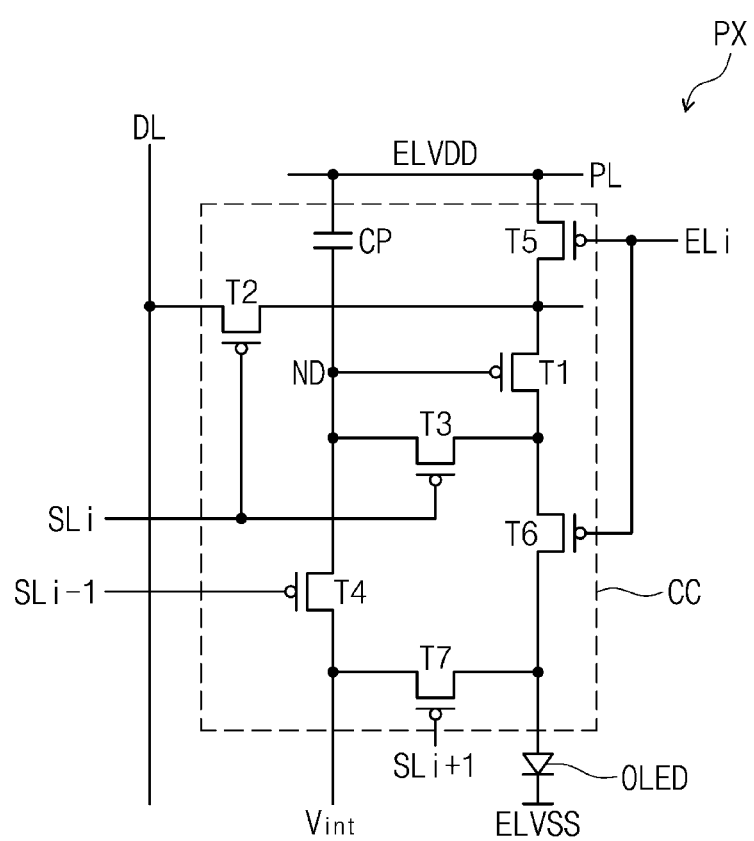
FIG. 3 schematically illustrates an equivalent circuit of a pixel arranged in the pixel layer illustrated in FIG. 2.

FIG. 3 schematically illustrates an equivalent circuit of a pixel arranged in the pixel layer illustrated in FIG. 2.

Referring to FIG. 3, each of the pixels PX may include a light emitting element OLED and a pixel circuit CC. The pixel circuit CC may include transistors T1 to T7 and a capacitor CP. The pixel circuit CC may control an amount of current flowing into the light emitting element OLED in response to a corresponding data voltage of the data voltages.

The light emitting element OLED may emit a light beam at a luminance level in correspondence to the amount of current provided from the pixel circuit CC. To this end, a first voltage ELVDD may be set to be higher than a second voltage ELVSS.

The transistors T1 to T7 may each include an input electrode (or a source electrode), an output electrode (or a drain electrode), and a control electrode (or a gate electrode). In this specification, for convenience, one of the input electrode and the output electrode may be referred to as a first electrode, and another as a second electrode.

The first electrode of a first transistor T1 may receive the first voltage ELVDD via a fifth transistor T5, and the second electrode thereof may be connected to an anode of the light emitting element OLED via a sixth transistor T6. The first transistor T1 may be defined as a drive transistor. The first transistor T1 may control the amount of current flowing into the light emitting element OLED, depending on a voltage applied to the control electrode of the first transistor T1.

A second transistor T2 may be connected between a corresponding data line DL of the data lines DL1 to DLn and the first electrode of the first transistor T1, and the control electrode of the second transistor T2 may be connected to an ith scan line SLi. The second transistor T2 may be turned on in case that an ith scan signal Si may be provided thereto through the ith scan line SLi, so that the second transistor T2 may electrically connect the data line DL to the first electrode of the first transistor T1.

A third transistor T3 may be connected between the second electrode and the control electrode of the first transistor T1. The control electrode of the third transistor T3 may be connected to the ith scan line SLi. The third transistor T3 may be turned on in case that the ith scan signal Si may be provided thereto through the ith scan line SLi, so that the third transistor T3 may electrically connect the second electrode and the control electrode of the first transistor T1. The first transistor T1 may be connected in the form of a diode in case that the third transistor T3 may be turned on.

A fourth transistor T4 may be connected between a node ND and an initialization power generator (not illustrated). The control electrode of the fourth transistor T4 may be connected to an (i−1)th scan line SLi−1. The fourth transistor T4 may be turned on in case that an (i−1)th scan signal Si−1 may be provided thereto through the (i−1)th scan line SLi−1, so that the fourth transistor T4 may provide an initialization voltage Vint to the node ND.

The fifth transistor T5 may be connected between a power line PL and the first electrode of the first transistor T1. The control electrode of the fifth transistor T5 may be connected to an ith light emission line ELi.

The sixth transistor T6 may be connected between the second electrode of the first transistor T1 and the anode of the light emitting element OLED. The control electrode of the sixth transistor T6 may be connected to the ith light emission line ELi.

A seventh transistor T7 may be connected between the initialization power generator (not illustrated) and the anode of the light emitting element OLED. The control electrode of the seventh transistor T7 may be connected to an (i+1)th scan line SLi+1. The seventh transistor T7 may be turned on in case that an (i+1)th scan signal Si+1 is provided thereto through the (i+1)th scan line SLi+1, so that the seventh transistor T7 may provide the initialization voltage Vint to the anode of the light emitting element OLED.

The capacitor CP may be disposed between the power line PL and the node ND. The capacitor CP may store the data voltage. In case that the fifth transistor T5 and the sixth transistor T6 may be turned on, the amount of current flowing in the first transistor T1 may be determined depending on the voltage stored in the capacitor CP.

Although the transistors T1 to T7 are illustrated on the basis of PMOS in FIG. 3, an embodiment of the disclosure is not limited thereto and the transistors T1 to T7 may be configured on the basis of NMOS in another embodiment of the disclosure.

Figure 4:
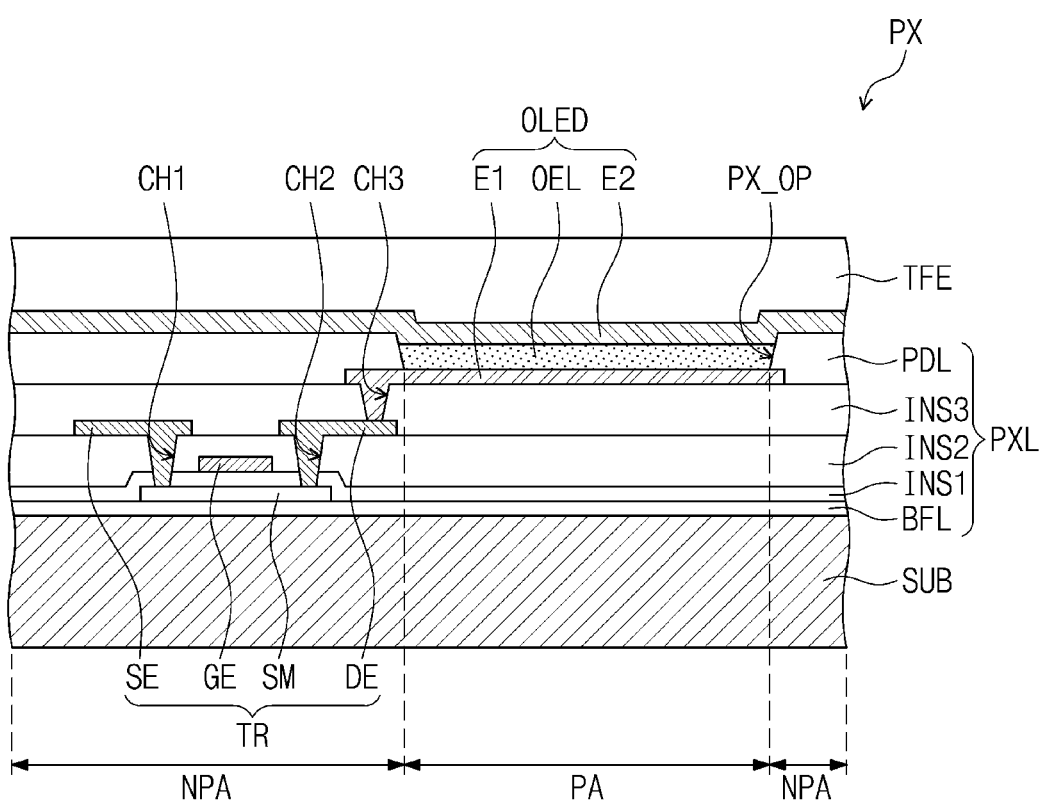
FIG. 4 is a schematic cross-sectional view of a portion corresponding to a light emitting element illustrated in FIG. 3.

FIG. 4 is a schematic cross-sectional view of a portion corresponding to the light emitting element illustrated in FIG. 3.

Referring to FIG. 4, the pixel PX may include the light emitting element OLED and a transistor TR connected to the light emitting element OLED. The light emitting element OLED may include a first electrode E1, a second electrode E2, and an organic light emitting layer OEL disposed between the first electrode E1 and the second electrode E2. The transistor TR may be the sixth transistor T6 illustrated in FIG. 3. The light emitting element OLED may be defined as an organic light emitting element.

The first electrode E1 may be the anode, and the second electrode E2 may be a cathode. The first electrode E1 may be defined as a pixel electrode, and the second electrode E2 may be defined as a common electrode.

The pixel PX may be divided into a pixel region PA and a non-pixel region NPA around the pixel region PA. The light emitting element OLED may be disposed in the pixel region PA, and the transistor TR may be disposed in the non-pixel region NPA.

The transistor TR and the light emitting element OLED may be disposed on the substrate SUB. A buffer layer BFL may be disposed on the substrate SUB and the buffer layer BFL may include an inorganic material.

A semiconductor layer SM of the transistor TR may be disposed on the buffer layer BFL. The semiconductor layer SM may include a semiconductor of an inorganic material such as amorphous silicon and polycrystalline silicon, or an organic semiconductor. The semiconductor layer SM may include an oxide semiconductor. Although not illustrated in FIG. 4, a source region, a drain region, and a channel region between the source region and the drain region may be included in the semiconductor layer SM.

A first insulating layer INS1 may be disposed on the buffer layer BFL so as to cover the semiconductor layer SM. The first insulating layer INS1 may include an inorganic material. A gate electrode GE of the transistor TR overlapping the semiconductor layer SM may be disposed on the first insulating layer INS1. The gate electrode GE may be disposed so as to overlap the channel region of the semiconductor layer SM.

A second insulating layer INS2 may be disposed on the first insulating layer INS1 so as to cover the gate electrode GE. The second insulating layer INS2 may include an organic material and/or an inorganic material.

A source electrode SE and a drain electrode DE of the transistor TR may be disposed to be spaced apart from each other on the second insulating layer INS2. The source electrode SE may be connected to the source region of the semiconductor layer SM through a first contact hole CH1 defined in the first insulating layer INS1 and the second insulating layer INS2. The drain electrode DE may be connected to the drain region of the semiconductor layer SM through a second contact hole CH2 defined in the first insulating layer INS1 and the second insulating layer INS2.

A third insulating layer INS3 may be disposed on the second insulating layer INS2 so as to cover the source electrode SE and the drain electrode DE of the transistor TR. The third insulating layer INS3 may be defined as a planarizing film for providing a flat upper surface, and may include an organic material.

The first electrode E1 may be disposed on the third insulating layer INS3. The first electrode E1 may be connected to the drain electrode DE of the transistor TR through a third contact hole CH3 defined in the third insulating layer INS3.

A pixel defining film PDL exposing a portion of the first electrode E1 may be disposed on the first electrode E1 and the third insulating layer INS3. An opening PX_OP for exposing the portion of the first electrode E1 may be defined in the pixel defining film PDL.

The organic light emitting layer OEL may be disposed on the first electrode E1 in the opening PX_OP. The organic light emitting layer OEL may generate light of color. For example, the organic light emitting layer OEL may emit any one of red light, green light, and blue light. However, the organic light emitting layer OEL is not limited thereto and may also generate white light by a combination of organic materials that generate red light, green light, and blue light.

The second electrode E2 may be disposed on the pixel defining film PDL and the organic light emitting layer OEL. The thin film encapsulation layer TFE may be disposed on the light emitting element OLED so as to cover the pixel PX. The layer between the substrate SUB and the thin film encapsulation layer TFE may be defined as the pixel layer PXL.

The first voltage ELVDD may be applied to the first electrode E1, and the second voltage ELVSS may be applied to the second electrode E2. A hole and an electron injected into the organic light emitting layer OEL may combine with each other to generate an exciton, and the light emitting element OLED may emit light while the exciton transitions to a ground state. The light emitting element OLED emits red light, green light, and blue light according to a current flow, and thus an image may be displayed.

Figure 5:
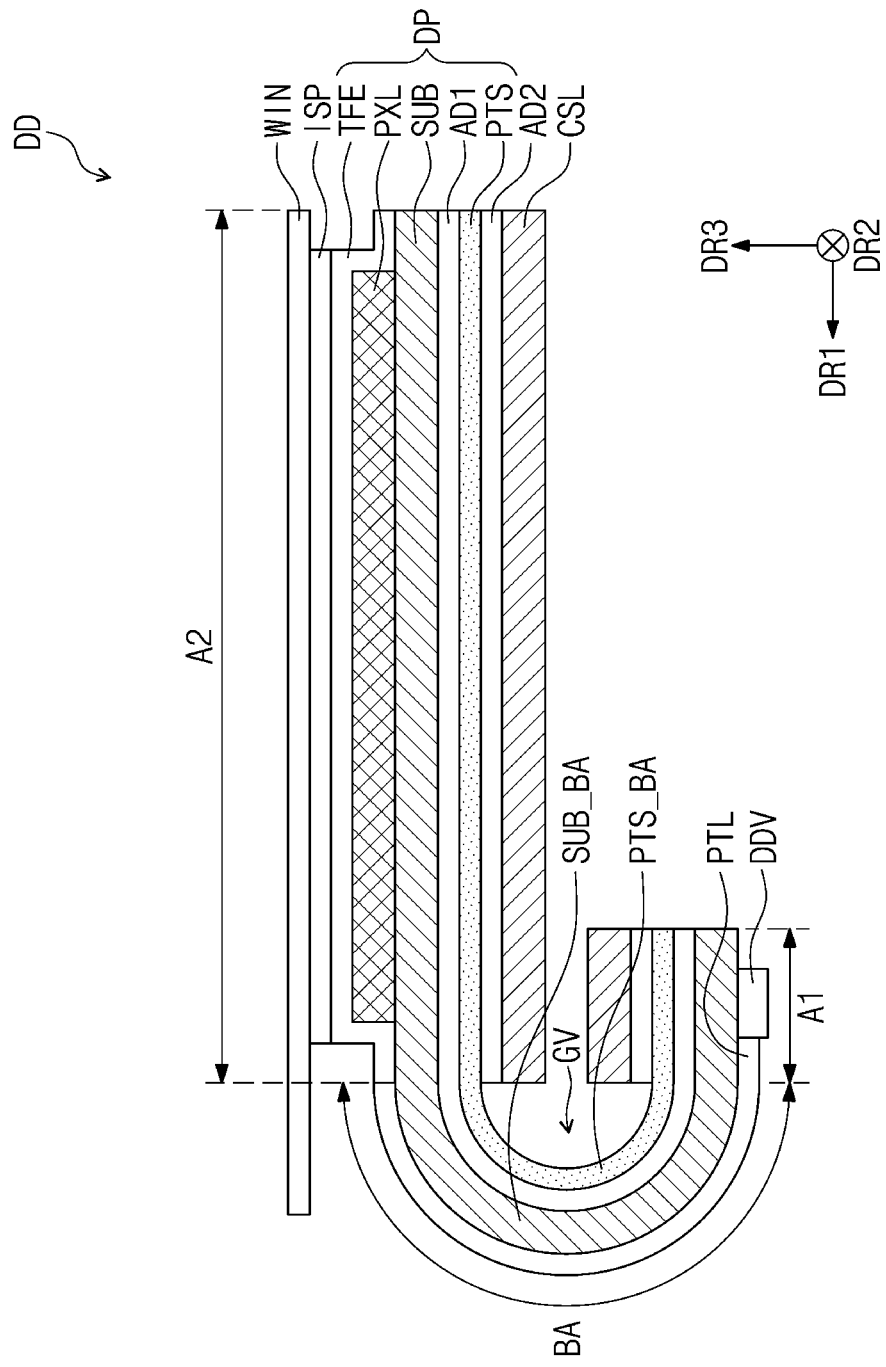
FIG. 5 schematically illustrates a bent state of a bending region illustrated in FIG. 2.

FIG. 5 schematically illustrates a bent state of the bending region illustrated in FIG. 2.

Referring to FIG. 5, the bending region BA may be bent toward the lower portion of the display panel DP. The substrate SUB may be bent at the bending region BA such that the first region A1 may overlap the second region A2. For example, the first region A1 may be disposed below the second region A2. Accordingly, the drive chip DDV may be disposed below the display panel DP. Because the first region A1 may be disposed below a rear surface of the second region A2, the bezel region of the display panel DP may be minimized when viewed in a plane.

Because the protective substrate PTS may have a thickness smaller than those of the substrate SUB and the cushion layer CSL, the thickness of the display panel DP may be reduced. The protective substrate PTS may include a polyimide having a modulus smaller than that of polyethylene terephthalate, and thus the protective substrate PTS may be easily bent in the bending region BA. Because the cushion layer CSL may not be disposed in the bending region BA, the thickness of the display device DD may be reduced in the bending region BA, and thus the substrate SUB may be more easily bent at the bending region BA.

As a result, according to an embodiment of the disclosure, the substrate SUB may be more easily bent at the bending region BA of the display panel DP, and the thickness of the display panel DP may be reduced.

Figure 6:
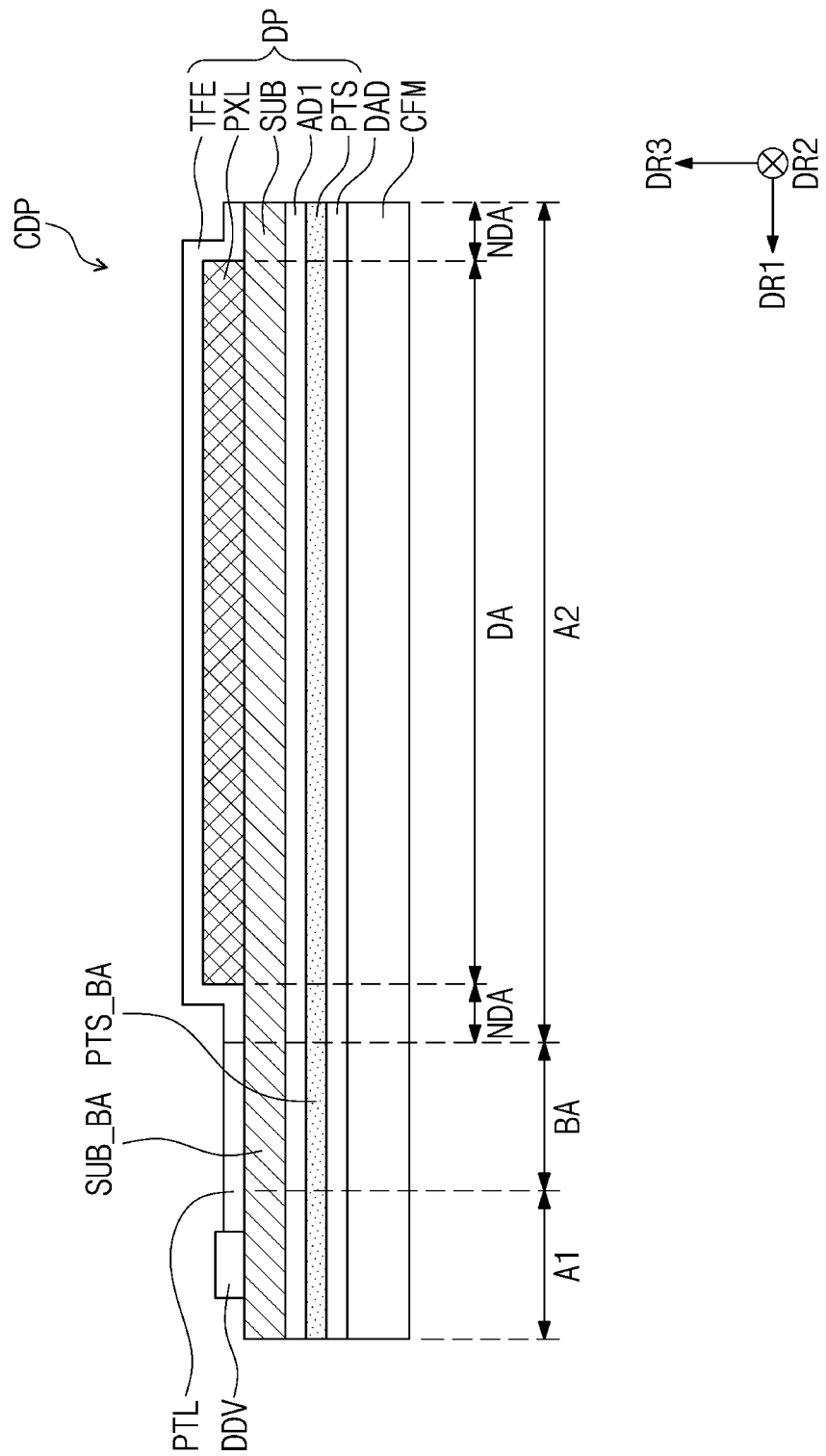
FIG. 6 schematically illustrates a carrier panel according to an embodiment.

FIG. 6 schematically illustrates a carrier panel according to an embodiment of the disclosure.

For ease of description, FIG. 6 illustrates a cross section corresponding to FIG. 2.

Referring to FIG. 6, a carrier panel CDP may include the display panel DP and a carrier film CFM disposed below the display panel DP. In manufacturing the display device DD, the carrier film CFM for protecting the lower portion of the display panel DP may be used in case that the display panel DP may be transferred to a process chamber. For example, the carrier film CFM may be disposed below the display panel DP and attached to the lower portion of the display panel DP.

A dummy adhesive layer DAD may be disposed between the protective substrate PTS and the carrier film CFM, and the carrier film CFM may be attached to the protective substrate PTS by the dummy adhesive layer DAD. The dummy adhesive layer DAD may have weaker adhesion than the first adhesive layer AD1.

The components of the display panel DP have been described above in detail, and thus a description thereof will be omitted.

As described above, because the protective substrate PTS including a polyimide having a small thickness and a low modulus may be disposed below the substrate SUB, the substrate SUB may be more easily bent at the bending region BA of the display panel DP, and the thickness of the display panel DP may be reduced. The portion of the substrate SUB at the bending region BA is designated as the first bending region SUB_BA, and the portion of the protective substrate PTS at the bending region BA is designate as the second bending region PTS_BA. As can be seen in FIG. 6, the second bending region PTS_BA overlaps the first bending region SUB_BA.

Figure 7:
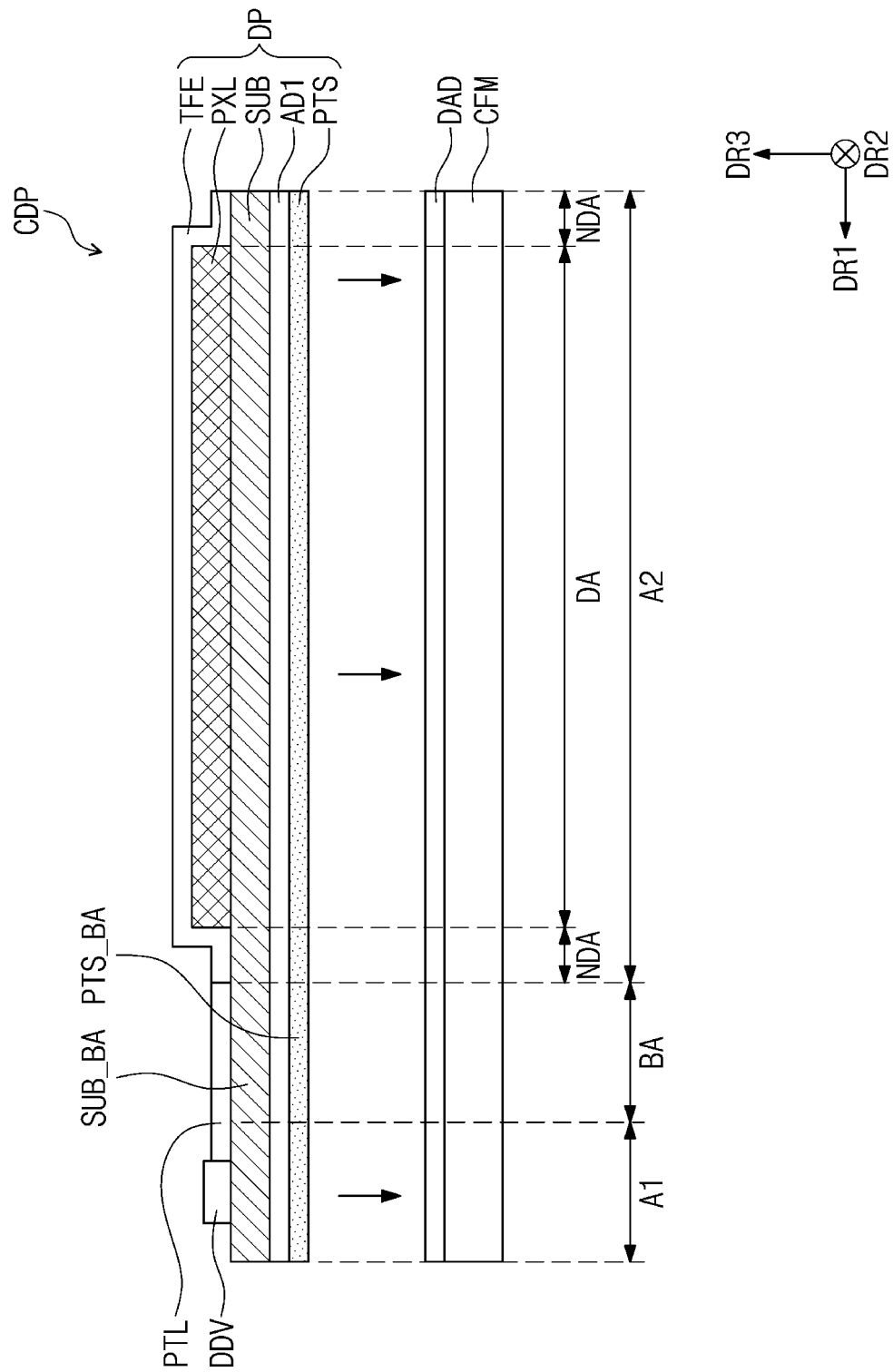
FIGS. 7 and 8 are schematic views for describing a manufacturing process of the display device using the carrier panel illustrated in FIG. 6.
Figure 8:
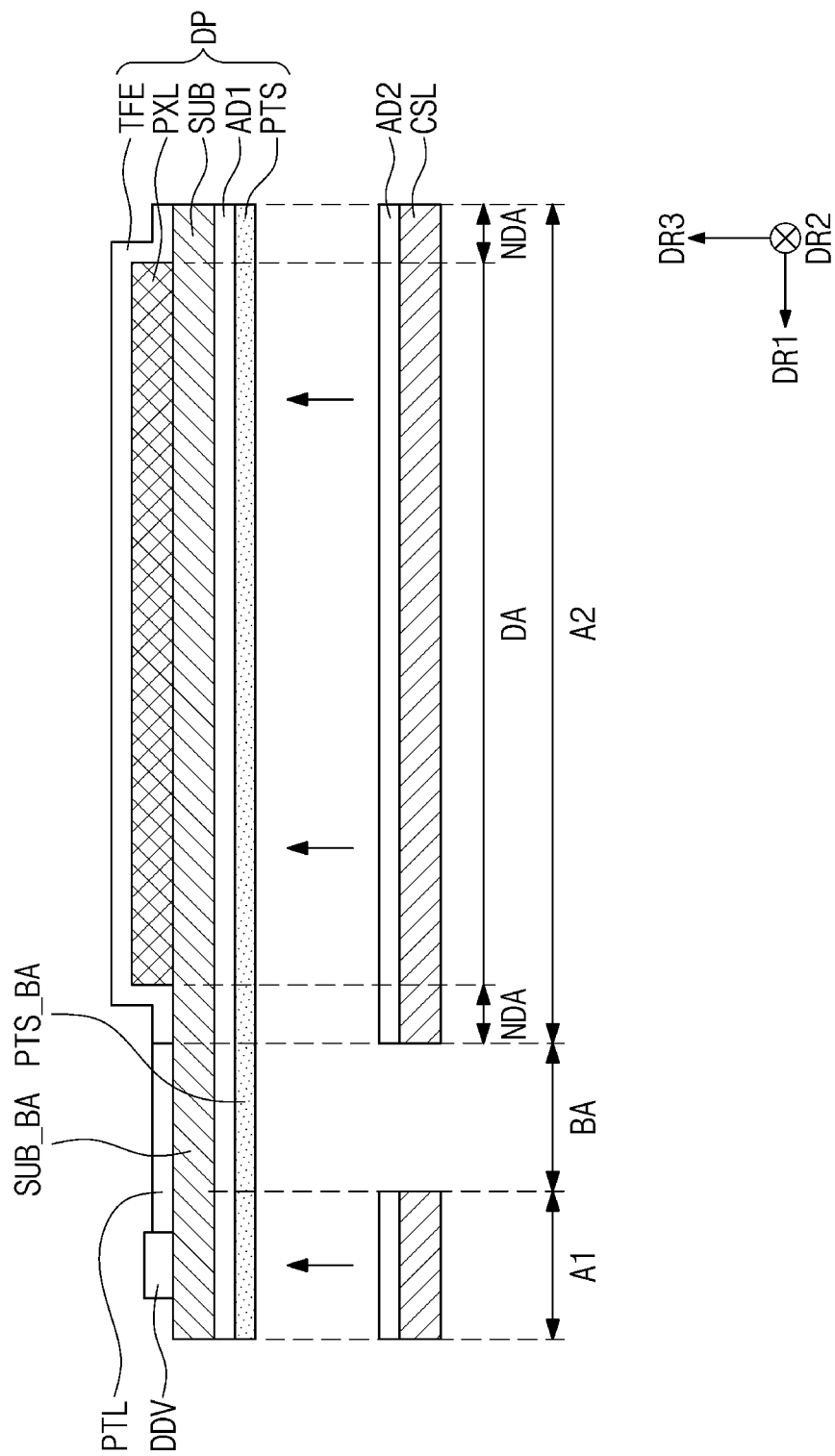

FIGS. 7 and 8 are schematic views for describing a manufacturing process of the display device using the carrier panel illustrated in FIG. 6.

Referring to FIG. 7, in a manufacturing process of the display device DD, the carrier film CFM may be detached from the display panel DP. For example, the dummy adhesive layer DAD and the carrier film CFM may be detached from the protective substrate PTS. Because the dummy adhesive layer DAD may have weaker adhesion than the first adhesive layer AD1, the dummy adhesive layer DAD and the carrier film CFM may be easily detached from the protective substrate PTS.

In the case that the dummy adhesive layer DAD may have stronger adhesion than the first adhesive layer AD1, the protective substrate PTS attached to the dummy adhesive layer DAD may be detached from the substrate SUB together with the carrier film CFM in case that the carrier film CFM may be detached from the display panel DP. Because the protective substrate PTS may be attached to the dummy adhesive layer DAD having stronger adhesion, the protective substrate PTS may be detached from the substrate SUB together with the carrier film CFM.

However, because the dummy adhesive layer DAD may have weaker adhesion than the first adhesive layer AD1 in an embodiment of the disclosure, the protective substrate PTS may not be detached in case that the carrier film CFM may be detached.

Referring to FIG. 8, the cushion layer CSL may be attached to the protective substrate PTS by the second adhesive layer AD2 after the carrier film CFM may be detached. Although not illustrated, the input sensing part ISP may be disposed on the thin film encapsulation layer TFE and the window WIN may be disposed on the input sensing part ISP to manufacture the display device DD.

Figure 9:
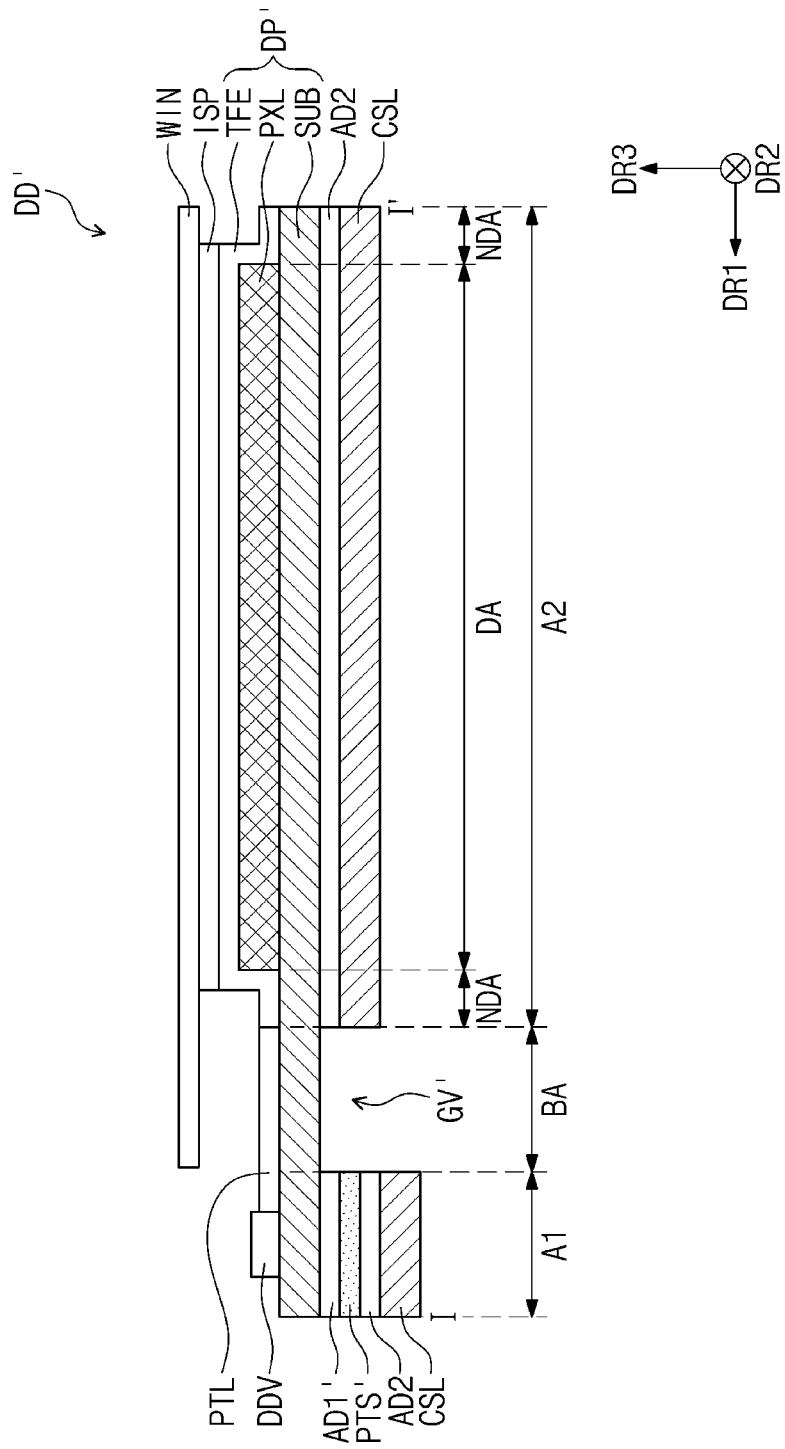
FIG. 9 is a schematic cross-sectional view of a display device according to another embodiment.
Figure 10:
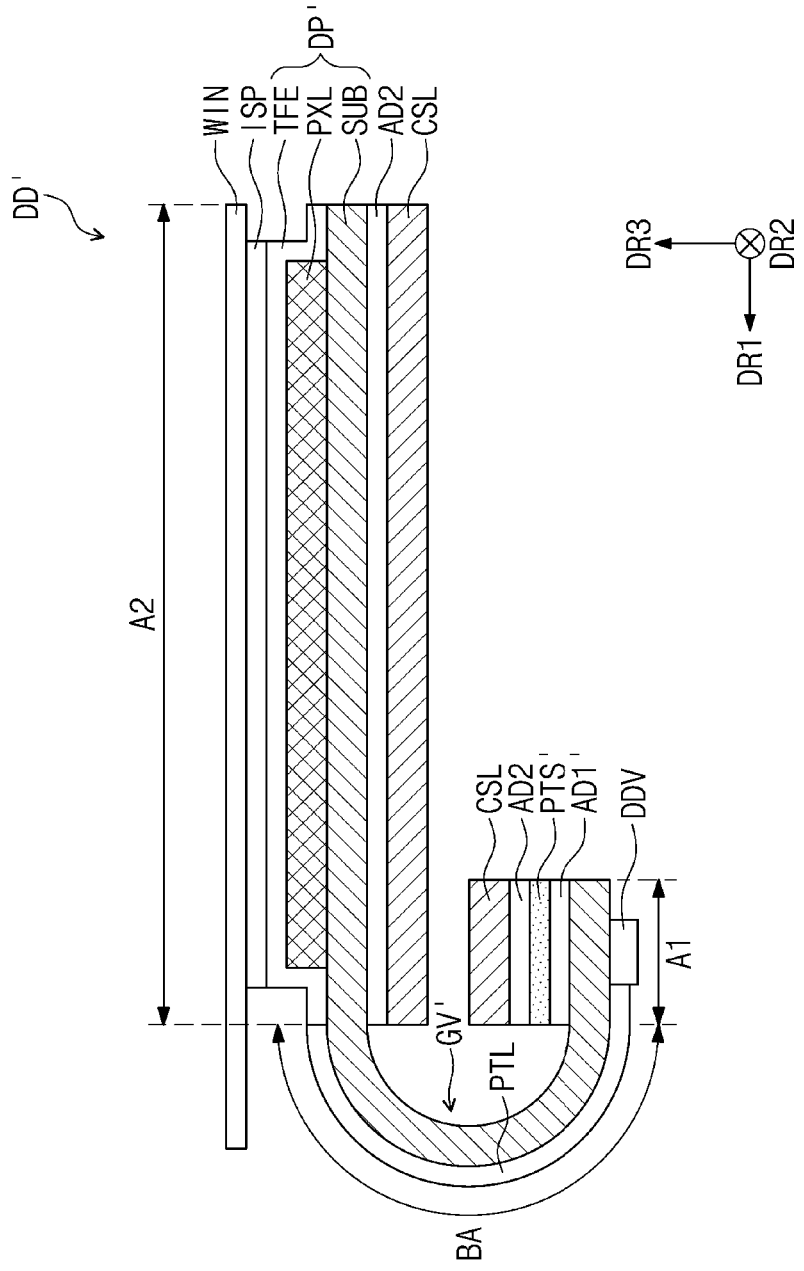
FIG. 10 schematically illustrates a bent state of the bending region illustrated in FIG. 9.

FIG. 9 is a schematic cross-sectional view of a display device according to another embodiment of the disclosure. FIG. 10 schematically illustrates a bent state of the substrate SUB at the bending region illustrated in FIG. 9.

Cross sections illustrated in FIGS. 9 and 10 may respectively correspond to cross sections illustrated in FIGS. 2 and 5, and a description of a display device DD' illustrated in FIGS. 9 and 10 will be given below focusing on components different from those of the display device DD illustrated in FIGS. 2 and 5. FIGS. 9 and 10 illustrate like components that FIGS. 2 and 5 illustrate using similar or the same reference numerals.

A protective substrate PTS' and the protective substrate PTS may differ. A display panel DP', the input sensing part ISP, and the window WIN illustrated in FIGS. 9 and 10 may be similar or the same as the display panel DP, the input sensing part ISP, and the window WIN illustrated in FIGS. 2 and 5.

Referring to FIG. 9, the protective substrate PTS' may be disposed below the substrate SUB in the first region A1. A first adhesive layer AD1' may be disposed between the substrate SUB and the protective substrate PTS' in the first region A1. The protective substrate PTS' may be attached to the substrate SUB by the first adhesive layer AD1' in the first region A1. The protective substrate PTS' may not be disposed in the bending region BA and the second region A2. The first adhesive layer AD1' may not be disposed in the bending region BA and the second region A2.

The cushion layer CSL may be disposed below the protective substrate PTS' in the first region A1 and the substrate SUB in the second region A2. The cushion layer CSL may not be disposed in the bending region BA.

The second adhesive layer AD2 may be disposed between the protective substrate PTS' and the cushion layer CSL in the first region A1, and between the substrate SUB and the cushion layer CSL in the second region A2. The cushion layer CSL may be attached by the second adhesive layer AD2 to the protective substrate PTS' in the first region A1 and to the substrate SUB in the second region A2. The second adhesive layer AD2 may not be disposed in the bending region BA. The cushion layer CSL and the second adhesive layer AD2 may define a groove GV' below the substrate in the bending region BA.

The protective substrate PTS' may include a colored polyimide similarly to the protective substrate PTS illustrated in FIG. 2, and may have a thickness smaller than those of the substrate SUB and the cushion layer CSL.

Referring to FIG. 10, the substrate SUB may be bent at the bending region BA toward a lower portion of the display panel DP', and thus the first region A1 may overlap the second region A2. For example, the first region A1 may be disposed below the second region A2. Because the protective substrate PTS' may have a thickness smaller than those of the substrate SUB and the cushion layer CSL, the thickness of the display panel DP' may be reduced. Because the protective substrate PTS' may not be disposed below the substrate SUB in the second region A2, the thickness of the display panel DP' may further be reduced.

Because the protective substrate PTS' may include a polyimide, the protective substrate PTS' may be easily bent in the bending region BA. Because the cushion layer CSL and the protective substrate PTS' may not be disposed in the bending region BA, the thickness of the display device DD' may become smaller in the bending region BA, and thus the substrate may be more easily bent at the bending region BA.

Figure 11:
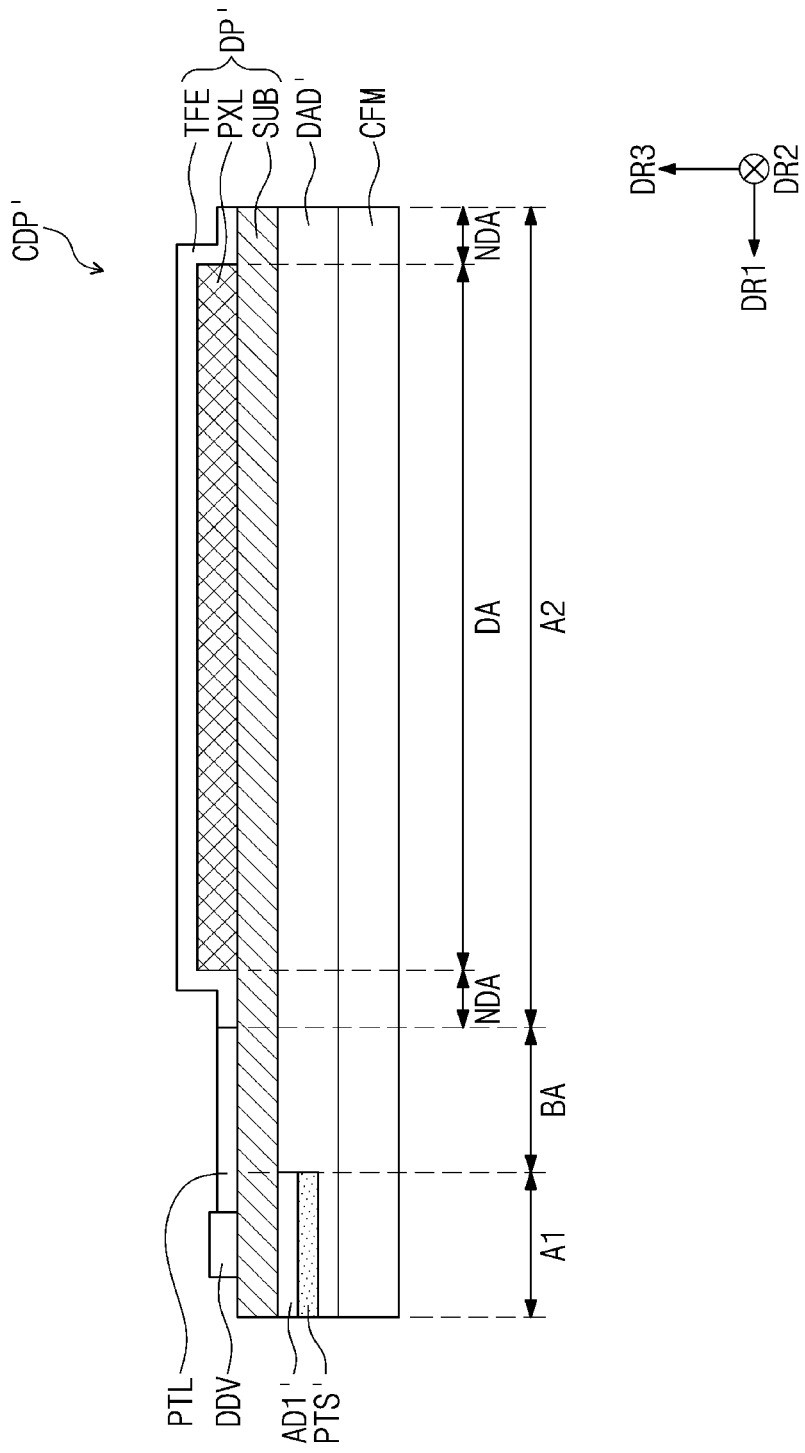
FIG. 11 schematically illustrates a carrier panel according to another embodiment.

FIG. 11 schematically illustrates a carrier panel according to another embodiment of the disclosure.

For ease of description, FIG. 11 illustrates a cross section corresponding to FIG. 9.

Referring to FIG. 11, a carrier panel CDP' may include the display panel DP' and the carrier film CFM disposed below the display panel DP'. The carrier film CFM may be attached to the lower portion of the display panel DP'.

In the first region A1, a dummy adhesive layer DAD' may be disposed between the protective substrate PTS' and the carrier film CFM. The dummy adhesive layer DAD' may be disposed between the substrate SUB and the carrier film CFM in the second region A2 and between the substrate SUB and the carrier film CFM in the bending region BA.

In the bending region BA and the second region A2, the protective substrate PTS' and the first adhesive layer AD1' may not be disposed, and the dummy adhesive layer DAD' may be disposed. The thickness of a portion of the dummy adhesive layer DAD' disposed in the bending region BA and the second region A2 may be greater than the thickness of another portion of the dummy adhesive layer DAD' disposed in the first region A1.

The carrier film CFM may be attached to the protective substrate PTS' and the substrate SUB by the dummy adhesive layer DAD'. The dummy adhesive layer DAD' may have weaker adhesion than the first adhesive layer AD1'.

Figure 12:
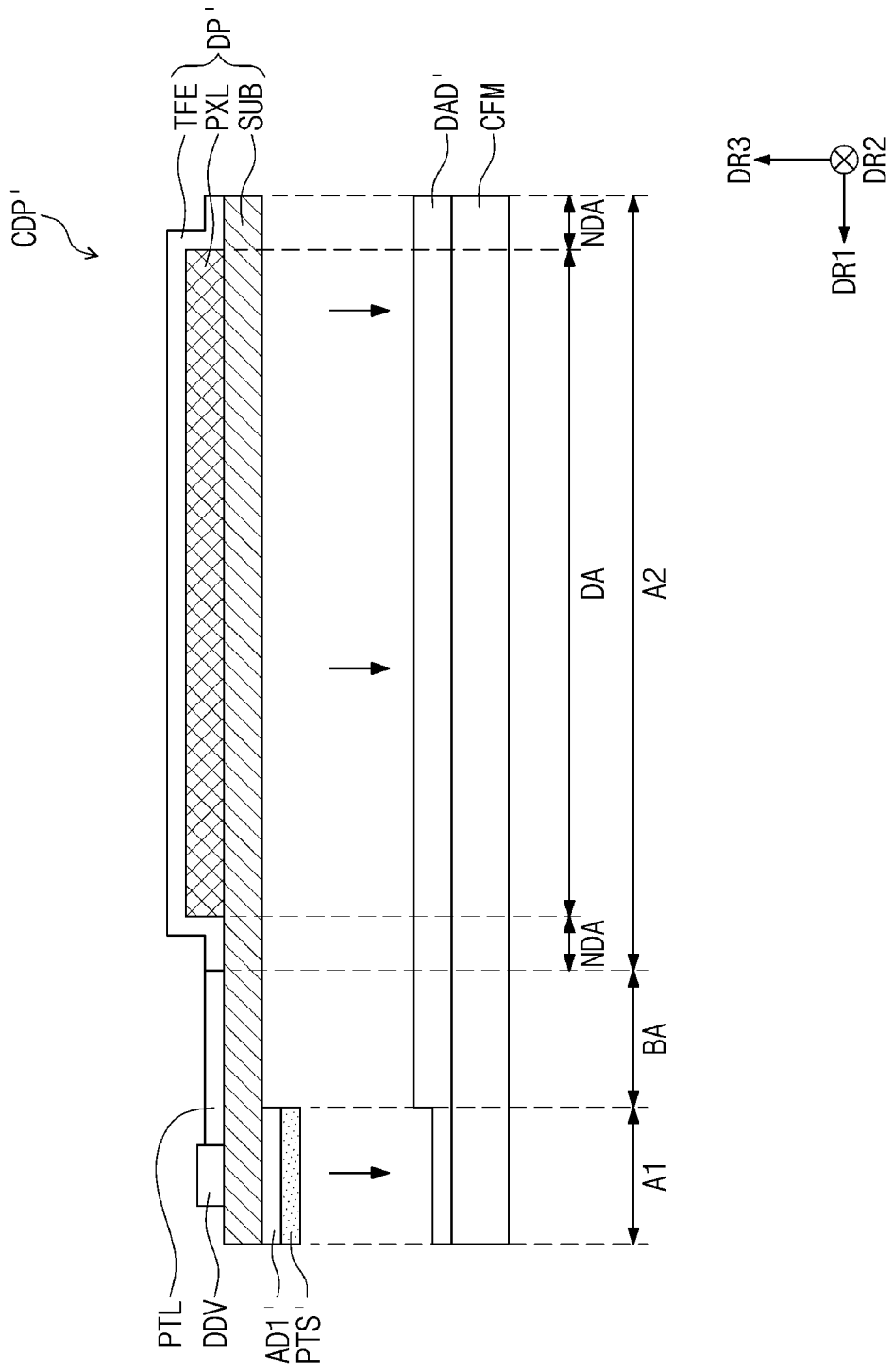
FIGS. 12 and 13 are schematic views for describing a manufacturing process of the display device using the carrier panel illustrated in FIG. 11.
Figure 13:
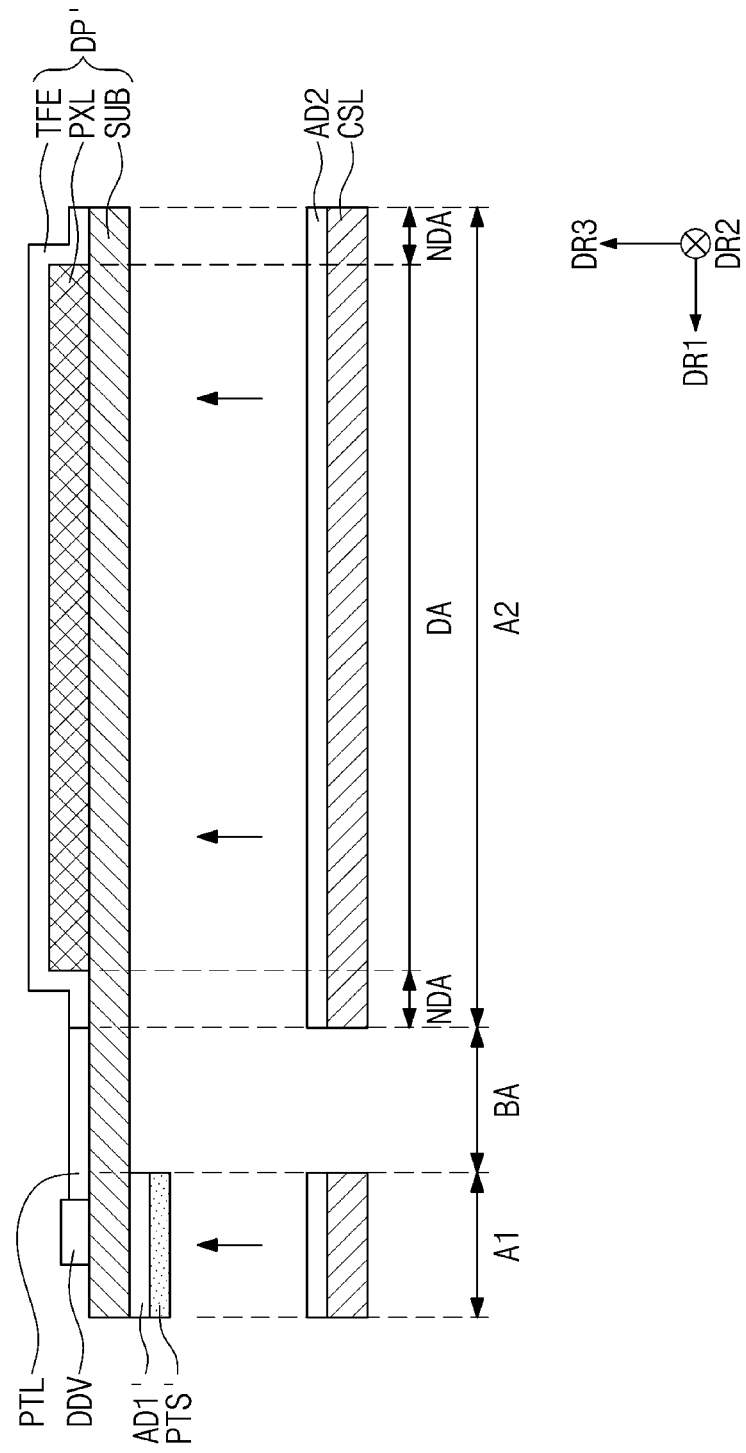

FIGS. 12 and 13 are schematic views for describing a manufacturing process of the display device using the carrier panel illustrated in FIG. 11.

Referring to FIG. 12, in a manufacturing process of the display device DD', the carrier film CFM may be detached from the display panel DP'. For example, the dummy adhesive layer DAD' and the carrier film CFM may be detached from the substrate SUB and the protective substrate PTS'. Because the dummy adhesive layer DAD' may have weaker adhesion, the dummy adhesive layer DAD' and the carrier film CFM may be easily detached from the substrate SUB and the protective substrate PTS'.

Referring to FIG. 13, after the carrier film CFM may be detached, the cushion layer CSL may be attached by the second adhesive layer AD2 to the protective substrate PTS' disposed in the first region A1 and to the substrate SUB in the second region A2. Although not illustrated, the input sensing part ISP may be disposed on the thin film encapsulation layer TFE and the window WIN may be disposed on the input sensing part ISP to manufacture the display device DD'.

According to an embodiment of the disclosure, because the protective substrate including a polyimide having a small thickness and a low modulus may be disposed below the substrate, the bending region of the display panel may be more easily bent and the thickness of the display panel may be reduced.

The embodiments described herein are not intended to limit the technical spirit and scope of the invention. Rather, while embodiments of the disclosure have been described herein, it is understood that various changes and modifications can be made by those skilled in the art. The embodiments, including those incorporating such changes and modifications, should be considered to be within the scope of the invention as defined by the following claims including any equivalents.

What is claimed is:

1. A display device comprising:
a substrate including a first region, a second region, and a first bending region between the first region and the second region;
a protective substrate disposed below the substrate and including a second bending region overlapping the first bending region;
a cushion layer disposed below the protective substrate in the first region and the second region, the cushion layer including a foam sheet;
a pixel layer disposed on the substrate in the second region; and
a drive chip disposed on the substrate in the first region, wherein
the second bending region is bent with the first bending region.

2. The display device of claim 1, wherein the substrate is bent at the bending region such that the first region is disposed under the second region.

3. The display device of claim 1, wherein the protective substrate comprises a polyimide.

4. The display device of claim 3, wherein the polyimide is colored.

5. The display device of claim 1, further comprising:
a first adhesive layer disposed between the substrate and the protective substrate; and
a second adhesive layer disposed between the protective substrate and the cushion layer.

6. The display device of claim 5, wherein the cushion layer and the second adhesive layer are disposed at an area excluding the bending region.

7. The display device of claim 1, wherein the second region comprises:
a display region; and
a non-display region adjacent to the display region, wherein the pixel layer is disposed on the substrate in the display region.

8. The display device of claim 7, further comprising:
a thin film encapsulation layer disposed on the substrate in the second region and covering the pixel layer;
an input sensing part disposed on the thin film encapsulation layer; and
a window disposed on the input sensing part and extending over the bending region.

9. The display device of claim 8, further comprising a protective layer disposed on the substrate in the bending region and extending to the drive chip.

10. The display device of claim 1, wherein the protective substrate has a thickness smaller than the thicknesses of the substrate.

11. The display device of claim 1, wherein the protective substrate has a thickness smaller than the thicknesses of the cushion layer.

12. The display device of claim 1, further comprising
wires disposed on the substrate and extending from the pixel layer to the data driver, and
a protective layer disposed on the wires in the bending region and extending to the drive chip.

13. The display device of claim 1, wherein the pixel layer includes transistors and light emitting diodes.

14. A display device comprising:
a substrate including a first region, a second region, and a first bending region between the first region and the second region;
a protective substrate disposed below the substrate and including a second bending region overlapping the first bending region;

a cushion layer disposed below the protective substrate in the first region and the second region;

a pixel layer disposed on the substrate in the second region; and a drive chip disposed on the substrate in the first region, where the second bending region is bent with the first bending region, and the protective substrate has a thickness smaller than a thicknesses of each of the substrate and the cushion layer.

15. The display device of claim 14, wherein the thickness of the protective substrate is in a range of about 5 μm to about 20 μm.

* * * * *